US006922422B2

United States Patent
Peters et al.

(10) Patent No.: US 6,922,422 B2
(45) Date of Patent: Jul. 26, 2005

(54) HEAT ISOLATION AND DISSIPATION STRUCTURES FOR OPTICAL COMPONENTS IN PHOTONIC INTEGRATED CIRCUITS (PICS) AND AN OPTICAL TRANSPORT NETWORK USING THE SAME

(76) Inventors: Frank H. Peters, 1170 Wilhelmina Way, San Jose, CA (US) 95120; Radhakrishnan L. Nagarajan, 7800 Creekline Dr., Cupertino, CA (US) 95014

( * ) Notice: Subject to any disclaimer, the term of this patent is extended or adjusted under 35 U.S.C. 154(b) by 280 days.

(21) Appl. No.: 10/283,475

(22) Filed: Oct. 30, 2002

(65) Prior Publication Data

US 2003/0086465 A1 May 8, 2003

Related U.S. Application Data

(60) Provisional application No. 60/350,218, filed on Nov. 2, 2001.

(51) Int. Cl.[7] .................................................. H01S 3/04
(52) U.S. Cl. .............................. 372/36; 372/34; 372/50; 385/14
(58) Field of Search ................................ 372/34, 36, 50; 385/14; 257/467, 469, 594, 625

(56) References Cited

U.S. PATENT DOCUMENTS

| 5,156,999 A | * | 10/1992 | Lee ............................. 438/25 |
| 5,305,344 A | * | 4/1994 | Patel ........................... 372/50 |
| 5,648,977 A | * | 7/1997 | Miyazaki ..................... 372/36 |
| 5,898,211 A | * | 4/1999 | Marshall et al. ............ 257/601 |
| 2002/0167013 A1 | * | 11/2002 | Iwasaki et al. ............... 257/79 |

* cited by examiner

Primary Examiner—Minsun Oh Harvey
Assistant Examiner—Cornelius H. Jackson
(74) Attorney, Agent, or Firm—W. Douglas Carothers, Jr.

(57) ABSTRACT

Photonic integrated circuits (PIC) semiconductor chips are provided with thermal isolation and/or heat dissipation structures between integrated optical components in the PIC chip, particularly integrated active optical components. These structures may also serve as a ground path for electrical circuitry on the PIC chip. An important function is the enhanced thermal isolation from, or dissipation of heat from, between adjacent or neighboring optical components in the PIC so that required spacing between adjacent optical components can be made even less than the thickness of the substrate thereby realizing a more compact optical component array on the monolithic PIC chips.

27 Claims, 6 Drawing Sheets

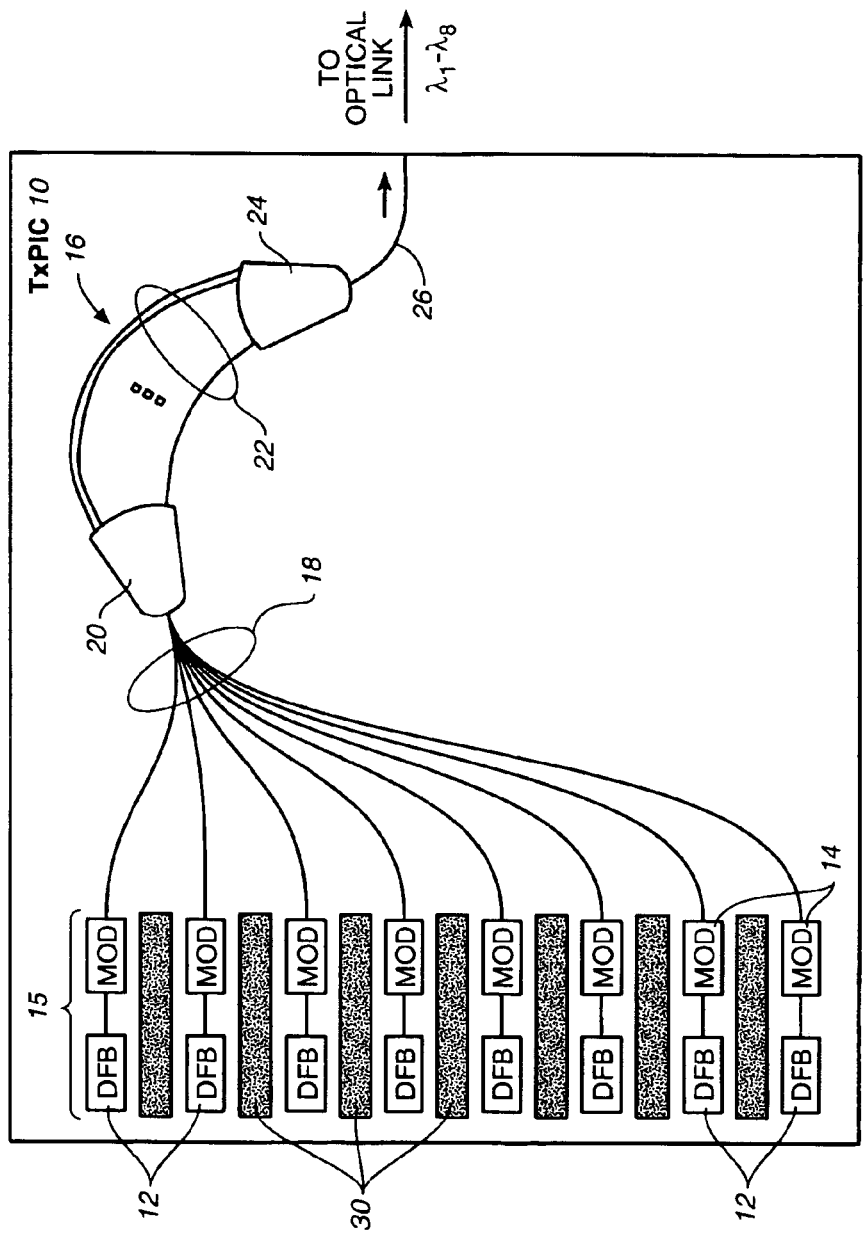
FIG._1

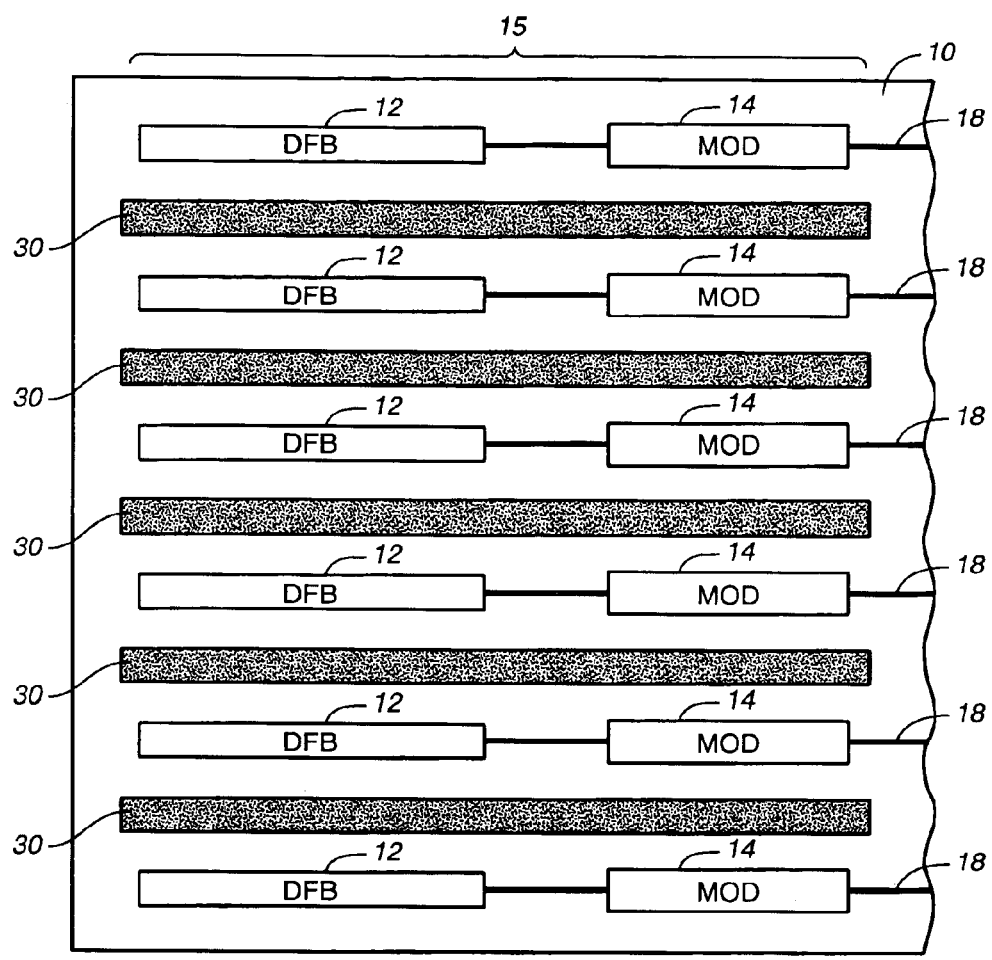
FIG._2

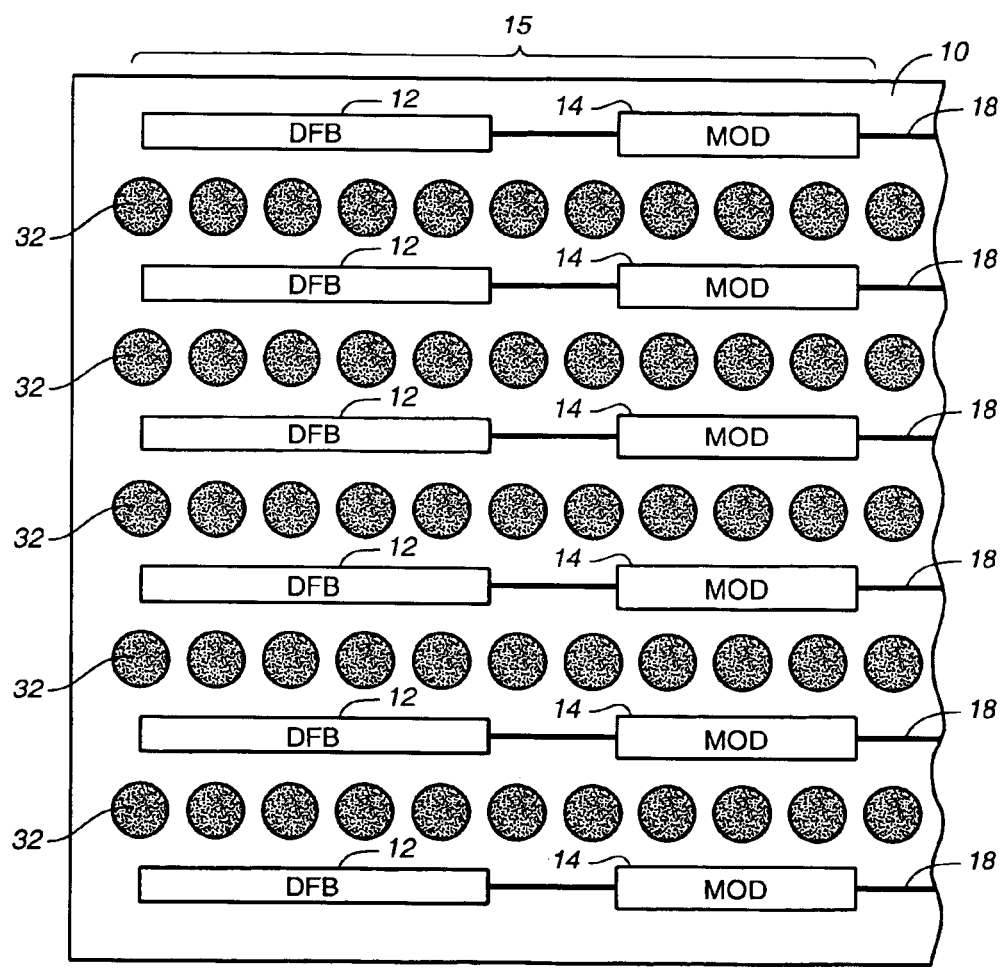
FIG._3

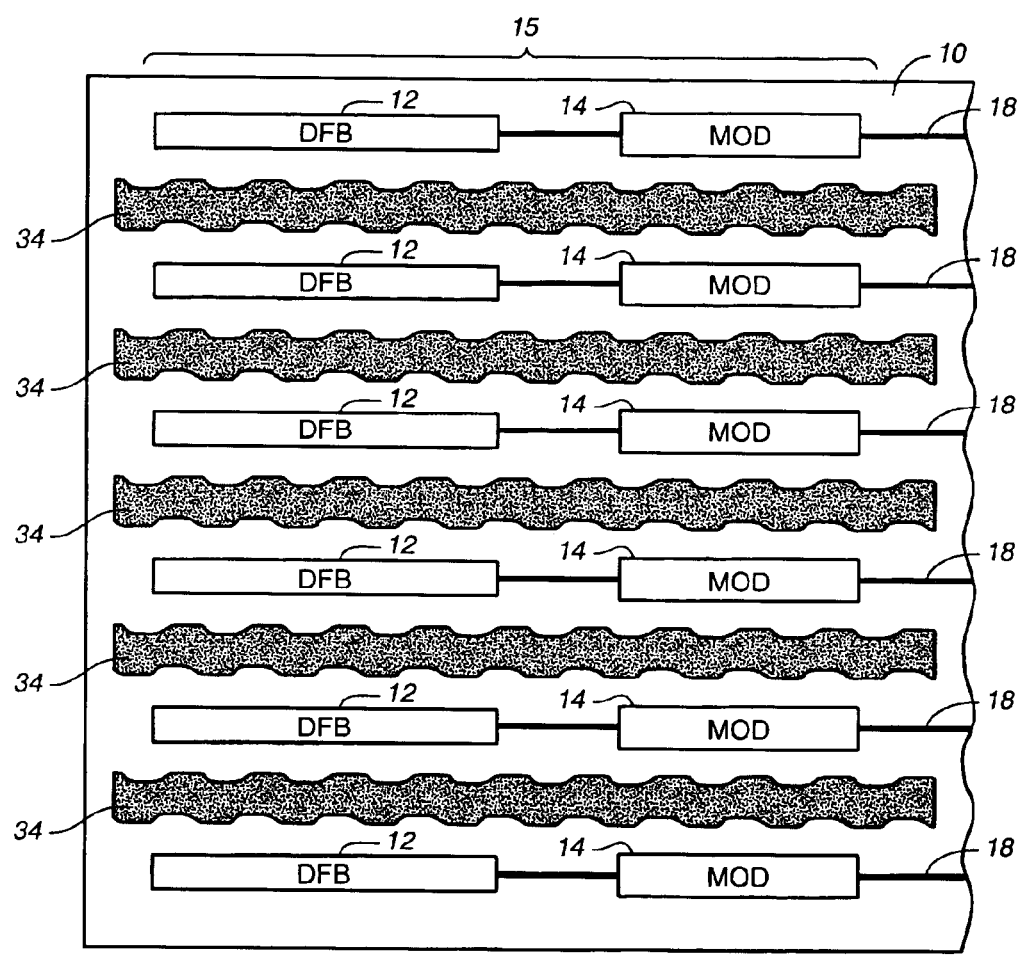
FIG._4

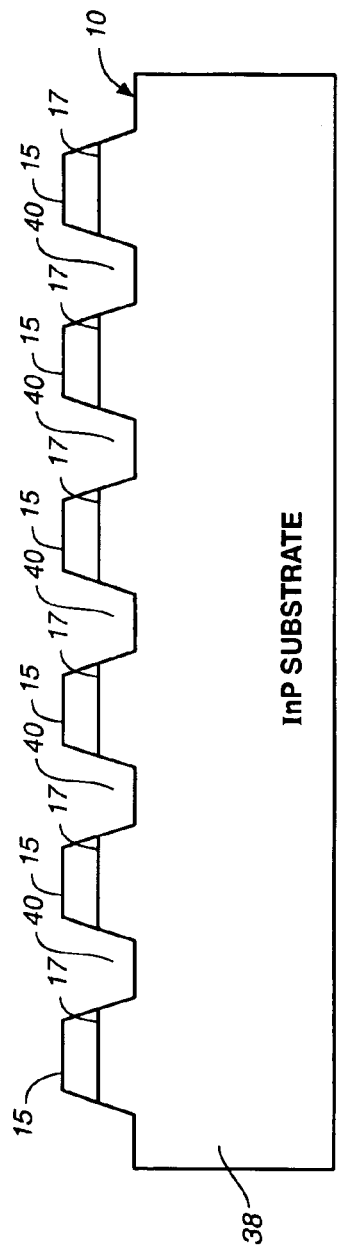
FIG._5
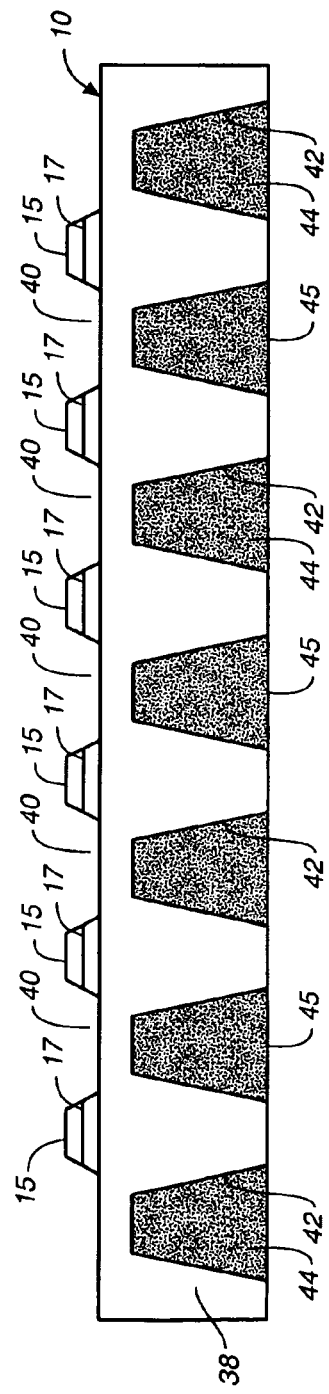
FIG._6

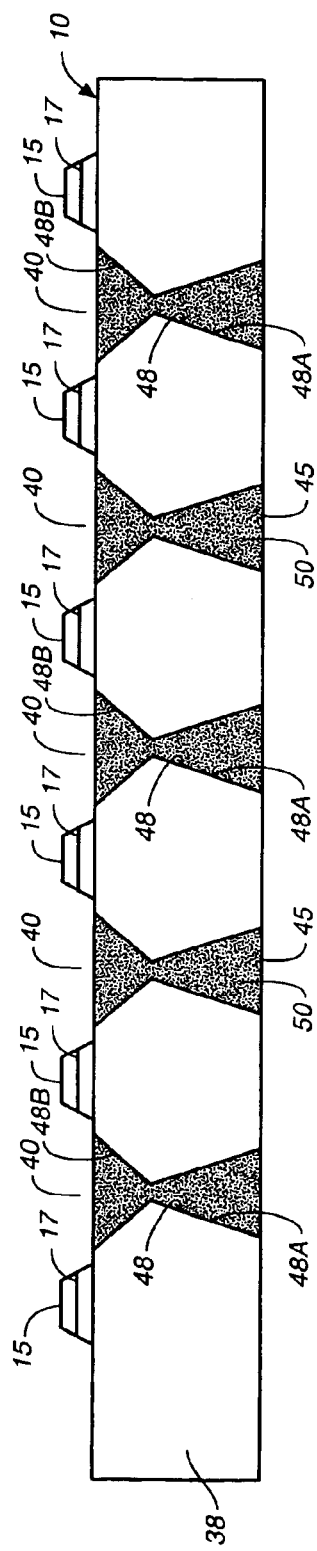
FIG._7
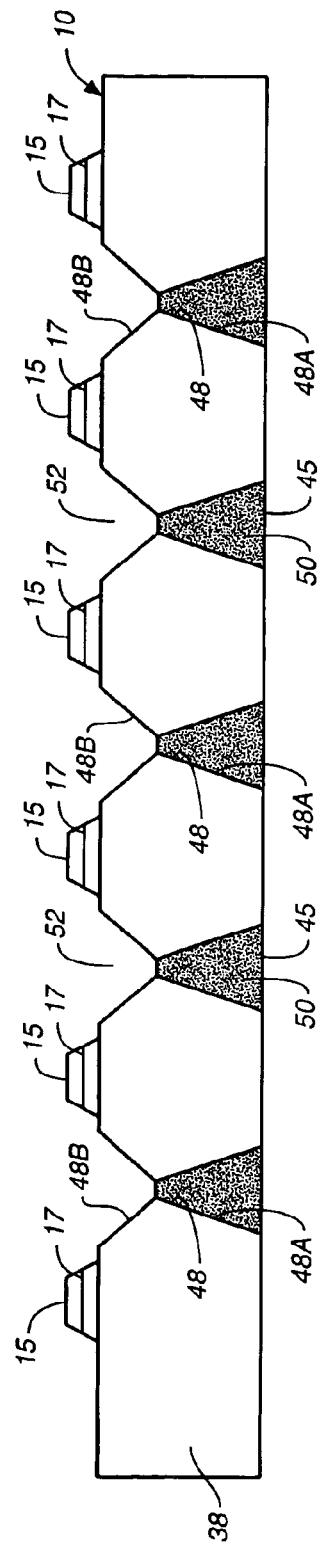
FIG._8

HEAT ISOLATION AND DISSIPATION STRUCTURES FOR OPTICAL COMPONENTS IN PHOTONIC INTEGRATED CIRCUITS (PICS) AND AN OPTICAL TRANSPORT NETWORK USING THE SAME

CROSS-REFERENCE TO RELATED APPLICATION

This application claims priority of U.S. provisional application, Ser. No. 60/350,218, filed Nov. 2, 2001, which application is incorporated herein by its reference.

BACKGROUND OF THE INVENTION

1. Field of the Invention

This invention relates generally to photonic integrated circuit (PIC) chips and more particularly to thermal isolation and heat dissipation of integrated optical components formed in a PIC chip or in a wafer comprising PIC chip die.

2. Description of the Related Art

In a photonic integrated circuit (PIC), many active and passive optical components are integrated on the same semiconductor substrate. Some active photonic devices or components require large amounts of input power and, as a result, generate a substantial amount of heat in the chip. For example, arrays of laser diodes (LDs), electro-optic modulators and/or semiconductor optical amplifiers (SOAs) on a single PIC chip may require large amounts of drive current and/or bias. If many of these optical components are to coexist monolithically on the same semiconductor support or substrate, it is important to insure that they are sufficiently thermally isolated or that heat generated by them can be efficiently dissipated away from adjoining components and off the PIC chip.

There are a number of methods that can be employed for thermal isolation in photonic devices or components integrated in PIC chips. Components are often separated physically, and the host wafer is often thinned. Typically, the rule of thumb is that, if the separation between optical components in the chip is much less than the thickness of the wafer, then the on-chip integrated optical or photonic components will need to be thermally isolated from one another.

Another method that is employed relates to the use of flip chip techniques for placement of chips onto a heatsink. If the heatsink has a higher thermal conductivity than the semiconductor substrate, the heat sink will serve to thermally isolate optical chip components that are adjacent to each other.

Both of these techniques have some problems. PIC devices are typically made on compound semiconductor wafers, e.g., fabricated on InP wafers, which are much more fragile than silicon wafers. As a result, although thinning a wafer helps with thermal isolation, it also results in increased wafer breakage and lowers chip yields. Flip-chip is often used for small photonic devices. For larger devices, the difference in the thermal expansion coefficient, the solder and the heat sink results in excess stress which, in turn, results in poor reliability. For a large photonic integrated circuit, flip chip is rendered impractical by the size of the optical components and the resultant PIC chip.

For high speed electronic circuits, holes or vias are often used to transfer the ground plane at the bottom of the semiconductor to the top surface. A via is created by etching a hole through the semiconductor and then filling the hole with metal, typically by means of electroplating.

OBJECTS OF THE INVENTION

It is an object of the present invention to overcome the aforementioned problems by providing improvements in optical component thermal isolation and/or heat dissipation.

SUMMARY OF THE INVENTION

According to this invention, a thermal isolation or dissipation structure is employed in PIC geometry comprising openings or vias, such as, for example, or holes or troughs or trenches, in a semiconductor chip or photonic integrated circuit (PIC) to provide a thermal path for on-chip integrated optical components to thermally isolate adjacently spaced optical components or provide a high thermally conductive path from between adjacent optical components. If need be, the formed conductive paths can also serve as an on-chip electrical conduit. Rather than using small vias purely for electrical connection, much larger sized vias are employed so that the thermal volume of the metal is substantial. Thus, the openings or vias may, respectively, extend partially into or through the body of the wafer or chip. The openings may extend into the top or bottom surface and preferably extend through openings into the bottom of the PIC substrate so that when the openings are filled with a thermally conductive material, the material will be in direct thermal contact with an underlying heatsink or other thermal submount for the PIC chip or chips. The heatsinks that may be employed, for example, are AlN, BeO, copper sandwiched BeO or CVD diamond. The important factor is that the coefficient of thermal expansion of the heatsink should substantially match that of the PIC chip. This becomes more critical with the development of a structure providing for thermal isolation and/or thermal dissipation paths built into the PIC chip thereby changing its coefficient of thermal expansion properties.

An important result of the deployment of this invention is that the distance between the large metal plated vias and the optical active integrated components can be made to be less than the substrate thickness thereby realizing a more compact optical component array on a PIC chip than previously thought possible. Thus, the primary path of heat flow would be laterally to the metal vias, rather than vertically through the substrate. Therefore, it is possible to use substrates that have not been thinned and do not have to be made thinner to meet the above mentioned rule of thumb. Neighboring optical components are now thermally isolated because the high thermal conductivity of the metal means that the vias will be maintained at a nearly constant temperature as the on-chip optical components heat up due to an applied bias or current. The metal used for the vias in any of the embodiments set forth in this description may be, for example, gold or aluminum.

The vias forming the structure may be left unfilled, i.e., empty (thermal isolation) as well as being filled with a thermally conductive material, such as a metal (thermal dissipation). Unfilled structures serve a similar purpose to isolate the optical components as in the case of filled vias where the heat is efficiently carried away. In either case of filled or unfilled, the openings or vias comprising the structure, being positioned between adjacent optical components integrated in the PIC chip, greatly reduces any lateral thermal conductivity, so that on-chip optical components will not longer experience thermal association with neighboring or adjacent optical components.

Thus, by laterally separating optical components by very low thermal conductivity material or by high conductivity material, both serve to thermally isolate them from neighboring optical components, provided, however, that in the case of the high conductivity material, the material should be contiguous with a heatsink submount for the PIC chip.

Other objects and attainments together with a fuller understanding of the invention will become apparent and appreciated by referring to the following description and claims taken in conjunction with the accompanying drawings.

BRIEF DESCRIPTION OF THE DRAWINGS

In the drawings wherein like reference symbols refer to like parts

FIG. 1 is a schematic plan view of a photonic integrated circuit (PIC) chip illustrating a first exemplary embodiment of a structure according to this invention.

FIG. 2 is an enlarged view of a portion of the PIC chip shown in FIG. 1.

FIG. 3 is an enlarge view of a portion of a PIC chip, similar to FIG. 2, illustrating a second exemplary embodiment of a structure according to this invention.

FIG. 4 is an enlarge view of a portion of a PIC chip, similar to FIG. 2, illustrating a third exemplary embodiment of a structure according to this invention.

FIG. 5 is a schematic cross-sectional view of a fourth exemplary embodiment shown in FIGS. 2–4.

FIG. 6 is a schematic cross-sectional view of a fifth exemplary embodiment of a structure according to this invention.

FIG. 7 is a schematic cross-sectional view of a sixth exemplary embodiment of a structure according to this invention.

FIG. 8 is a schematic cross-sectional view of a seventh exemplary embodiment of a structure according to this invention.

DETAILED DESCRIPTION OF THE INVENTION

Reference is now made to FIG. 1 which illustrates one example of a PIC chip 10. The example shown in FIG. 1 is a transmitter photonic integrated circuit (TxPIC) chip, but it should be understood that in the employment of the thermal isolation/dissipation structure according to this invention, any PIC chip requiring thermal separation of neighboring optical components, whether active or passive types of such optical components, can be employed. While the invention herein may have its best functioning relative to thermal isolation or heat dissipation from between active optical components, i.e., components requiring an applied bias or current or other applied energy in order to perform a photonic function, it should be understood that the utility of this invention also extends to passive optical components, i.e., components that require no applied bias or current or other energy source to perform a photonic function, such as in cases, for example, where the passive optical component optical properties may be affected by changes in temperature, such as changes in refractive index.

TxPIC chip 10 is shown in more detail in earlier filed U.S. patent applications, Ser. No. 10/267,331, now Pub. No. US2003/0095737A1, published May 23, 2003, and Ser. No. 10/267,346, now Pub. No. US2003/001878A1, published May 1, 2003, both of which applications were filed on Oct. 8, 2002 and are incorporated herein by their reference. PIC chip 10 is deployed in an optical transmitter (Tx) module such as disclosed in U.S. patent application, Ser. No. 10/267, 212, filed Oct. 8, 2002, now Pub. No. US2003/0099018A1, published 29, 2003, which application is incorporated herein by its reference.

Chip 10 comprises an array of DFB lasers 12 optically coupled to an array of electro-optic modulators (EOMs) 14, which are optically coupled, via waveguides 18, to an optical combiner 16, shown here as an arrayed waveguide grating (AWG) 16. As, an example, TxPIC chip 10 may have eight signal channels with different channel wavelengths of $\lambda_1$ to $\lambda_8$ forming a first wavelength grid approximating that of a standardized wavelength grid. However, the number of channels may be greater than eight channels, the latter depending upon the ability to spatially integrate an array of semiconductor modulator/laser (SML) sets 15 on a chip while providing minimal cross-talk levels.

Other types of optical combiners may be utilized instead of an AWG 16 shown in FIG. 1. For example, optical combiner 16 may be a power coupler, a star coupler, a MMI coupler or an Echelle grating. AWG combiner 16 is an optical combiner of choice because of its capability of providing narrow passbands for the respective channel signals with low insertion loss. AWG combiner 16, as known in the art, comprises an input slab or free space region 20, a plurality of grating arms 22 of predetermined increasing length, $\Delta L$, and an output slab or free space region 24. The multiplexed channel signal output from slab 24 is provided to an output waveguide 26 for exit from chip 10, such as optical coupling the multiplexed channel signal output to an optical fiber (not shown).

As explained in the above incorporated applications, chip 10 may be comprise of Group III–V compound semiconductors, in particular, for example, InGaAsP/InP or AlInGaAs/InP alloys. In these chips, a coupling core waveguide or a continuous core waveguide is formed along each optical path comprising a respective SML set 15 to a respective input of optical combiner 16 and then to output waveguide 26 of chip 10. The core waveguide is, for example, InGaAsP or AlInGaAs. As shown in both FIGS. 1 and 2, between each of the SML sets 15 is formed a structure 30 providing thermal isolation or for heat dissipation, or both, between adjacent SML sets 15 each comprising an optically coupled laser 12 and modulator 14. Structure 30 is shown for isolating entire components of sets 15. However, thermal isolator/dissipater structure 30 can also be limited to be between any spatially neighboring components, e.g., between adjacent or neighboring DFB lasers 12.

As will be seen, structure 30 may be an opening or via, or may be an opening or via filled with a thermal conductive material, such as a metal. However, the purposes of FIG. 1, along with FIGS. 2–4, are to illustrate a few examples of the geometry for such thermal isolating and heat dissipating structures. Other examples will be readily come to mind by those familiar with this art upon seeing these exemplary geometries. In this regard, the geometry shown in FIG. 2 comprises an opening or via, such as a rectangle 30 formed between adjacent SML sets 15 in chip 10. As shown in FIG. 3, the geometry need not be continuous between sets 15, but rather can be a plurality of spatially separated openings, such as circles 32, or squares, triangles, polygons, or other geometrical shapes. As shown in FIG. 4, the geometry can be "wavy" or with uneven edges, e.g., a scrolling kind of geometry shown at 34. These openings or vias 30, 32 and 34 can extend into the chip from the bottom or from the top of chip 10. Also, it is within the scope of this invention that combinations of such geometries may be employed between adjacent optical components 12 or 14 in chip 10.

Reference now is made to FIG. 5 which illustrates, in cross-section, chip 10 through either the region of either DFB lasers 12 or EOMs 14, representing the multiple SML sets 15. In FIG. 5, the core waveguide 17 is illustrated for each SML set 15, comprising just one of a plurality of layers formed on an InP substrate 38, such as by means of MOCVD or MBE. Adjacent or neighboring SML sets 15 are thermally isolated from one another by means of an opening 40 such as a trough or groove. In this manner, the heat generated from a neighboring SML set 15 or its components cannot directly effect the operation of another adjacent SML set 15. In FIG. 5, grooves 40 can have any desirable geometrical shape such as discussed above in connection with the geometries of FIGS. 2–4.

Reference is now made to FIG. 6 which illustrates, in cross-section, another chip 10 having a plurality of structures 44 formed in grooves or openings 42 formed through the bottom of InP substrate 38 in combination with openings 40. Openings 42 can have any desirable geometrical shape such as discussed above in connection with the geometries of FIGS. 2–4. Openings 42 are then filled with a thermally conductive material, such as gold or aluminum. The bottom surfaces 25 of the formed thermal dissipaters 44 are place in thermal contact with a heatsink or other such submount (not shown) such as AlN, BeO, copper sandwiched BeO or CVD diamond. In this manner, the heat generated from SML sets 15 is thermally conducted through channels 44 directly to the heatsink rather than laterally to neighboring SML sets 15. The use of metal filled structures 44 in conjunction with heatsink also applies to any of the other embodiments in this disclosure.

Reference is now made to FIG. 7 which illustrates another embodiment for thermal isolation or heat dissipation comprising vias 48 formed through the semiconductor bulk such as by means of selective etching between adjacent SML sets 15 or their individual optical components 12 or 14. As shown in FIG. 7, a selective etch is performed on one side of chip 10 forming a set of larger openings 48A and, then, formed from the otherside of chip 10 forming a set of smaller openings 48B. Etching is completed when through-vias 48 are formed. The geometric shape of vias 48 can have any desirable geometrical shape such as discussed above in connection with the geometries of FIGS. 2–4. The vias 48 can then be maintained, as is, to provide for thermal isolation between the SML sets 15 or, alternatively, filed with a thermally conductive material 50, as shown in FIG. 7.

It should be noted that an additional advantage of the embodiment of FIG. 7 is that the on-chip, metal-filled vias 48 provide an electrical conduit for current supply paths between the top and bottom surface of the chip which can facilitate the wire bonding when packaging chip 10 in a module package. For example, the metal-filed vias can function as electrical ground paths for active components or can function, in part, as microwave shielding for adjacently disposed electro-optic modulators 14 to reduce RF cross-talk between the modulators.

Reference is now made to the embodiment shown in FIG. 8, which is the same as that shown in FIG. 7 except that only the larger portion 48A of vias 48 are filed with a thermally conductive material while the smaller portion 48B of vias 48 are left as open space. Thus, in this embodiment, thermal isolation is provided between neighboring SML sets 15 is provided by means of openings 48B, while accompanying heat dissipation is provided from between SML sets 15 by means of openings 48A filled with thermal conductive material 50.

While the invention has been described in conjunction with several specific embodiments, it is evident to those skilled in the art that many further alternatives, modifications and variations will be apparent in light of the foregoing description. Thus, the invention described herein is intended to embrace all such alternatives, modifications, applications and variations as may fall within the spirit and scope of the appended claims.

What is claimed is:

1. A photonic integrated circuit (PIC) comprising:
   a plurality of optical components integrated on a semiconductor substrate of predetermined thickness, together as integrated, forming a monolithic optical component array, and
   heat isolation/dissipation structures formed between adjacent optical integrated components in the component array to provide thermal isolation or a thermally conductive path, or both, between the optical integrated components so that a spacing between adjacent optical integrated components in the circuit required for thermal isolation of or heat dissipation between optical integrated components in the monolithic optical component array can be reduced to a spacing that is less than the thickness of the semiconductor substrate allowing for an increase in optical integrated component density of the monolithic optical component array to be formed in the circuit.

2. The integrated photonic circuit (PIC) of claim 1 wherein the structures comprise a via formed between adjacent optical components that extend through the PIC.

3. The integrated photonic circuit (PIC) of claim 2 wherein the geometric cross-sectional shape of the vias comprises a polygon, square, triangle, circle, parallelepiped, or wavy or irregularly shaped geometry.

4. The integrated photonic circuit (PIC) of claim 2 wherein the structures are electrical circuit conducts or microwave shielding.

5. The integrated photonic circuit (PIC) of claim 2 wherein the structures have a metal fill.

6. The integrated photonic circuit (PIC) of claim 5 wherein the metal fill comprises gold or aluminum.

7. The integrated photonic circuit (PIC) of claim 1 wherein the structures comprise openings formed between adjacent optical components that extend into the PIC either from its top surface or from its bottom surface, or both, to provide thermal isolation between optical components.

8. The integrated photonic circuit (PIC) of claim 7 wherein the openings are filled with a metal fill to provide for high thermal dissipation away from the optical components.

9. The integrated photonic circuit (PIC) of claim 8 wherein the metal fill is either gold or aluminum.

10. The integrated photonic circuit (PIC) of claim 1 wherein the structures comprise openings formed between adjacent optical components that extend into the PIC from its top surface to provide thermal isolation between optical components and openings formed between adjacent optical components that extend a via formed between adjacent optical components that extend into the PIC from its bottom surface to provide thermal isolation between the optical components.

11. The integrated photonic circuit (PIC) of claim 10 wherein the openings into the PIC from its bottom surface are filled with a metal.

12. The integrated photonic circuit (PIC) of claim 11 wherein the metal fill is either gold or aluminum.

13. An optical transport network comprising:
   a photonic integrated circuit (PIC) comprising a plurality of optical components integrated on a semiconductor substrate forming a monolithic optical component array, and heat isolation/dissipation structures formed between adjacent optical integrated components in the component array to provide thermal isolation or a thermally conductive path, or both, between the optical integrated components so that a spacing between adjacent optical integrated components required for thermal isolation of or heat dissipation between optical integrated components in the monolithic optical component array can be reduced to a spacing that is less than the thickness of the semiconductor substrate allowing for an increase in optical integrated component density of the monolithic optical component array to be formed in the circuit.

14. The optical transport network of claim 13 wherein the structures comprise a via formed between adjacent optical components that extend through the PIC.

15. The optical transport network of claim 14 wherein the geometric cross-sectional shape of the vias comprises a polygon, square, triangle, circle, parallelepiped, or wavy or irregularly shaped geometry.

16. The optical transport network of claim 14 wherein the structures are electrical circuit conducts or microwave shielding.

17. The optical transport network of claim 14 wherein the structures have a metal fill.

18. The optical transport network of claim 17 wherein the metal fill comprises gold or aluminum.

19. The optical transport network of claim 13 wherein the structures comprise openings formed between adjacent optical components that extend into the PIC either from its top surface or from its bottom surface, or both, to provide thermal isolation between optical components.

20. The optical transport network of claim 19 wherein the openings are filled with a metal fill to provide for high thermal dissipation away from the optical components.

21. The optical transport network of claim 20 wherein the metal fill is either gold or aluminum.

22. The optical transport network of claim 13 wherein the structures comprise openings formed between adjacent optical components that extend into the PIC from its top surface to provide thermal isolation between optical components and openings formed between adjacent optical components that extend a via formed between adjacent optical components that extend into the PIC from its bottom surface to provide thermal isolation between the optical components.

23. The optical transport network of claim 22 wherein the openings into the PIC from its bottom surface are filled with a metal.

24. The optical transport network of claim 23 wherein the metal fill is either gold or aluminum.

25. A method of providing a higher density of optical integrated components formed on a semiconductor substrate which is part of a fragile semiconductor wafer having a predetermined thickness and together providing a monolithic photonic integrated circuit (PIC) without the necessity of reducing the thickness of the semiconductor substrate to maintained any required thermal isolation of or heat dissipation from the optical integrated components while increasing chances of semiconductor wafer breakage, comprising the steps of:
   reducing spacing between optical integrated components that are adjacent to one another in the circuit to a spacing that is less than the thickness of the semiconductor substrate; and
   forming a thermal isolation between the adjacent optical integrated components, without also reducing semiconductor wafer thickness, the thermal isolation extending at least between adjacent optical integrated components or extending at least into the semiconductor substrate between adjacent optical integrated components or extending through the semiconductor substrate and between adjacent optical integrated components to a wafer surface between such components, the thermal isolation, respectively, comprising an opening between the adjacent optical integrated components or in the semiconductor substrate between the adjacent optical integrated components or a via through the semiconductor substrate and between adjacent optical integrated components to the wafer surface.

26. The method of claim 25 comprising the further step of providing for heat dissipation from the circuit by filling the openings or vias with a thermally conductive material.

27. The method of claim 26 wherein the thermally conductive material is gold or aluminum.

* * * * *